(12) United States Patent
Cheong et al.

(10) Patent No.: US 8,232,128 B2
(45) Date of Patent: *Jul. 31, 2012

(54) METHOD OF TEXTURING SOLAR CELL AND METHOD OF MANUFACTURING SOLAR CELL

(75) Inventors: Juhwa Cheong, Seoul (KR); Sungjin Kim, Seoul (KR); Jiweon Jeong, Seoul (KR); Younggu Do, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/905,907

(22) Filed: Oct. 15, 2010

(65) Prior Publication Data
US 2011/0027933 A1 Feb. 3, 2011

Related U.S. Application Data

(63) Continuation of application No. 12/411,942, filed on Mar. 26, 2009, now Pat. No. 7,858,426.

(30) Foreign Application Priority Data

Mar. 26, 2008 (KR) .................. 10-2008-0027996

(51) Int. Cl.
*H01L 21/00* (2006.01)
*H01L 21/302* (2006.01)
*H01L 21/461* (2006.01)
(52) U.S. Cl. .................. 438/57; 438/745; 257/E21.215
(58) Field of Classification Search .................... None
See application file for complete search history.

(56) References Cited

U.S. PATENT DOCUMENTS

| 5,964,953 | A | 10/1999 | Mettifogo |
| 7,989,346 | B2 * | 8/2011 | Letize et al. .................. 438/674 |
| 2001/0029978 | A1 | 10/2001 | Nakai et al. |
| 2005/0247674 | A1 | 11/2005 | Kubelbeck et al. |

FOREIGN PATENT DOCUMENTS

| EP | 1 753 032 A1 | 2/2007 |
| EP | 1 826 829 A2 | 11/2007 |
| KR | 10-1998-0072419 A | 11/1998 |
| WO | WO 2007/129555 A1 | 11/2007 |

* cited by examiner

*Primary Examiner* — Seahvosh Nikmanesh
(74) *Attorney, Agent, or Firm* — Birch, Stewart, Kolasch & Birch, LLP

(57) ABSTRACT

Methods of texturing and manufacturing a solar cell are provided. The method of texturing the solar includes texturing a surface of a substrate of the solar cell using a wet etchant, and the wet etchant includes a surfactant.

17 Claims, 6 Drawing Sheets

METHOD OF TEXTURING SOLAR CELL AND METHOD OF MANUFACTURING SOLAR CELL

This application is a Continuation of application Ser. No. 12/411,942 filed on Mar. 26, 2009 now U.S. Pat. No. 7,858,426, which claims priority to and the benefit of Korean Patent Application No. 10-2008-0027996 filed in the Korean Intellectual Property Office on Mar. 26, 2008, the entire contents of which are incorporated herein by reference.

BACKGROUND OF THE INVENTION

1. Field

Embodiments relate to methods of texturing and manufacturing a solar cell.

2. Description of the Related Art

Recently, as existing energy sources such as petroleum and coal are expected to be depleted, interests in alternative energy sources for replacing the existing energy sources are increasing. Among the alternative energy sources, a solar cell is a cell generating electric energy from solar energy and has been particularly spotlighted because the solar cell uses abundant solar energy, does not cause environmental pollution, and has a long life time.

The solar cell is divided into a silicon solar cell, a compound semiconductor solar cell, and a tandem solar cell, depending on a raw material. The silicon solar cell has been mainly used in a solar cell market.

A general silicon solar cell includes a substrate and an emitter layer formed of a semiconductor and having different conductive types such as a p-type and an n-type, and electrodes formed on the substrate and the emitter layer, respectively. At this time, a p-n junction is formed at an interface between the substrate and the emitter layer.

When light is incident on the solar cell, a plurality of pairs of electrons and holes are generated in the semiconductor. The pairs of electrons and holes are separated into electrons and holes by the photovoltaic effect, respectively, and the separated electrons and holes are called carriers. Thus, the separated electrons move toward the n-type semiconductor (ex. the emitter layer) and the separated holes move the p-type semiconductor (ex. the substrate), and then the electrodes and holes are collected by the electrodes electrically connected to the emitter layer and the substrate, respectively. The electrodes are connected to each other using electric wires to thereby obtain an electric power.

A reflectance of the incident light on the semiconductor needs to be reduced so as to improve a conversion efficiency of the solar cell for converting light energy into electric energy. For this, a method of texturing a surface of the semiconductor has been used.

SUMMARY

In one aspect, there is a method of texturing a solar cell, the method comprising texturing a surface of a substrate of the solar cell using a wet etchant, and the wet etchant includes a surfactant.

In another aspect, there is a method of manufacturing a solar cell, the method comprising forming an emitter layer on a substrate having a first conductive type, the emitter layer having a second conductive type opposite to the first conductive type, texturing a surface of the emitter layer using a wet etchant, forming a first electrode contacting the textured emitter, and forming a second electrode contacting the substrate, and the wet etchant includes a surfactant.

The wet etchant may be an alkaline wet etchant.

The alkaline wet etchant may be an etchant including an alkaline solution of 0.5 wt % to 23.5 wt % and the surfactant of 0.01 wt % to 0.1 wt % in pure water.

The alkaline solution may be at least one selected from the group consisting of the potassium hydroxide (KOH), sodium hydroxide (NaOH) and ammonium hydroxide (NH4OH) and a mixed solution thereof.

The substrate may be a single crystal silicon substrate.

The wet etchant may be an acidic wet etchant.

The acidic wet etchant may be an etchant including the surfactant in an acidic wet etch solution of HF and HNO3.

The acidic wet etchant may be an etchant including a HF solution of about 5 wt % to 30 wt %, a HNO3 solution of about 29 wt % to 75 wt %, and the surfactant of about 0.1 wt % to 3 wt % in pure water.

The substrate may be a polycrystalline substrate.

The surfactant may be a fluorine-containing surfactant.

The texturing may include generating a plurality of air bubbles by reacting the wet etchant and the substrate, the bubbles adhering on a surface of the substrate, wherein an etchant rate of first portions of the surface on which the bubbles are adhered may be different from an etchant rate of second portions of the surface on which the bubbles are not adhered.

The surface may be at least upper portion of the substrate.

BRIEF DESCRIPTION OF THE DRAWINGS

The present invention will become more apparent by describing preferred embodiments thereof in detail with reference to the accompanying drawings in which.

DETAILED DESCRIPTION

Figure 1A:
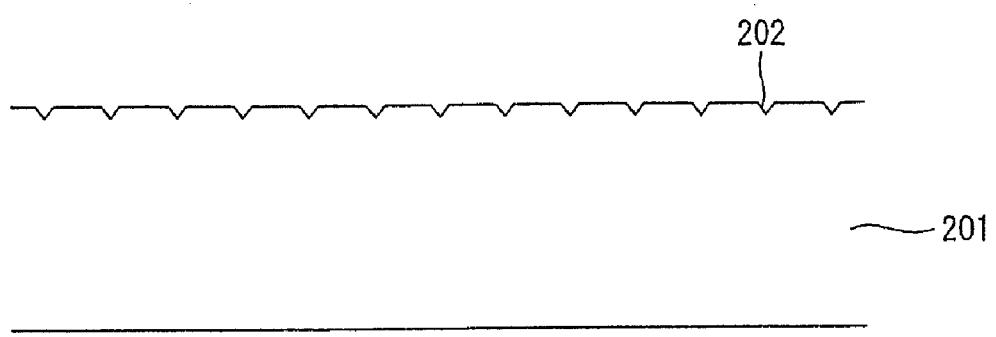
FIGS. 1A to 1D are cross-sectional view sequentially illustrating a texturing method of an upper portion of a substrate for a solar cell according to an exemplary embodiment of the present invention.

The present invention will be described more fully hereinafter with reference to the accompanying drawings, in which preferred embodiments of the inventions invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Referring to FIGS. 1A to 1D and FIG. 2, a method of texturing an upper portion of a substrate for a solar cell according to an exemplary embodiment of the present invention will be described.

Figure 1B:
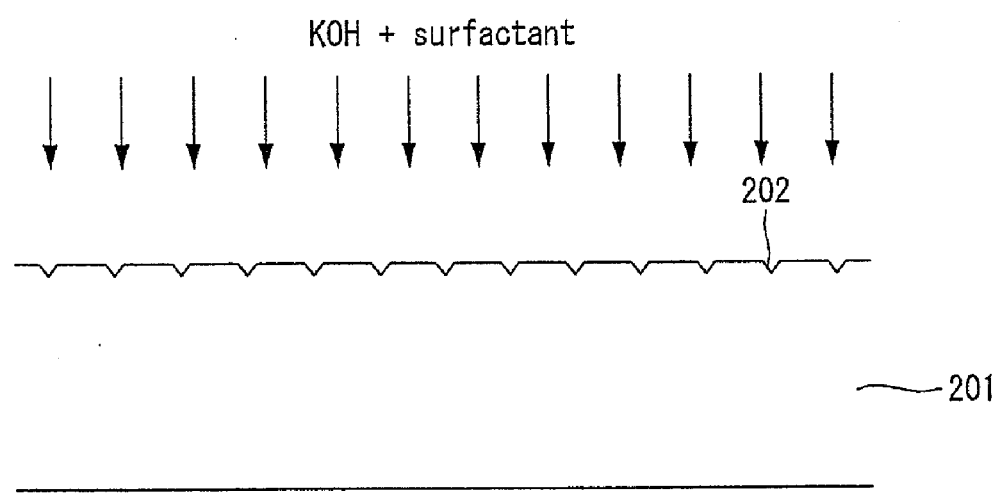
Figure 1C:
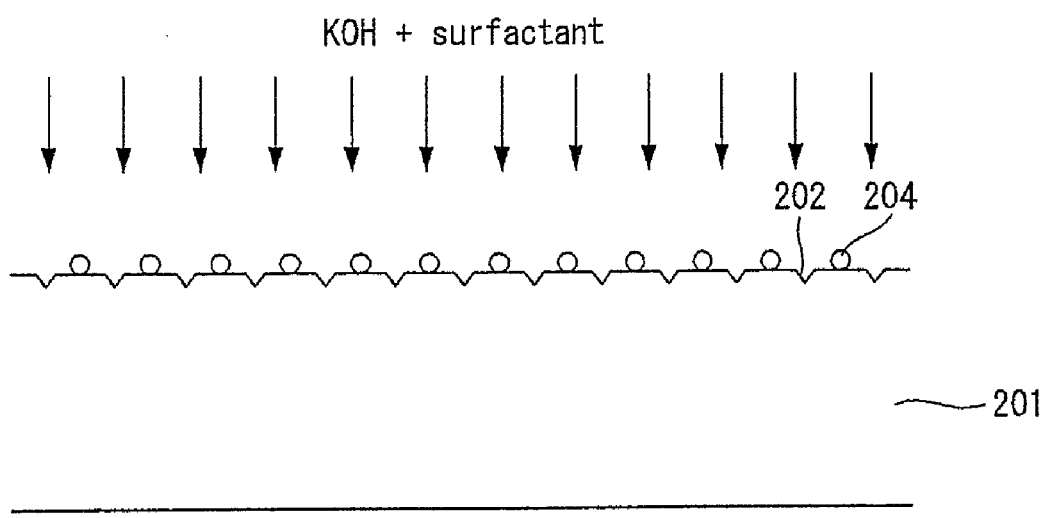
Figure 1D:
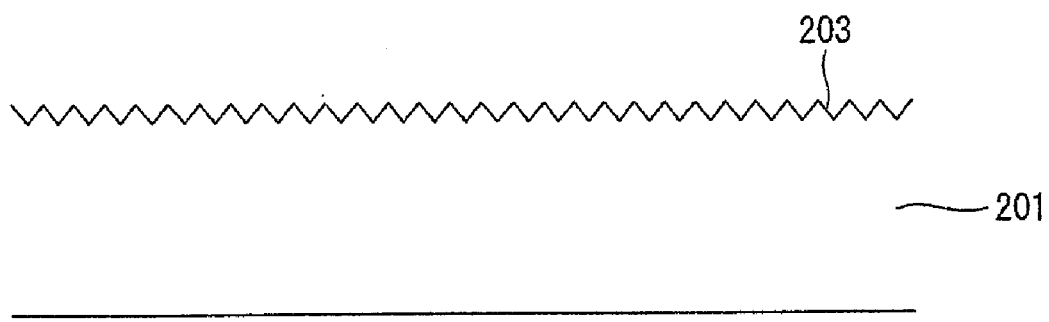
Figure 2:
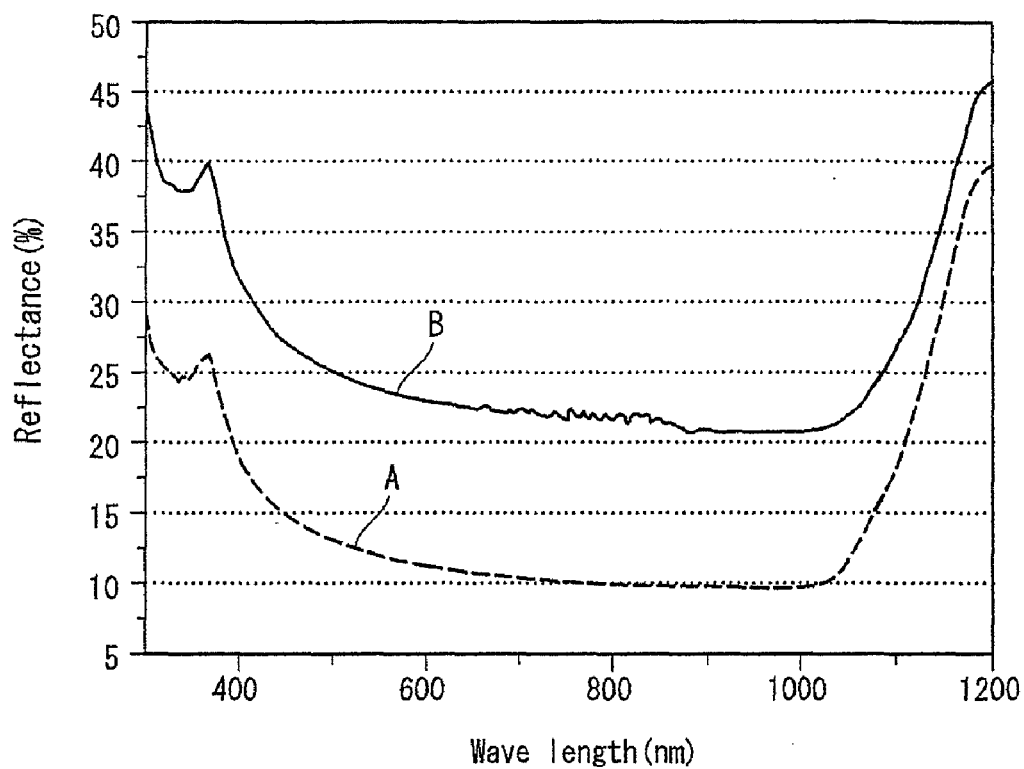
FIG. 2 is a graph showing reflectances measured in a substrate manufactured by FIGS. 1A to 1D and in a substrate manufactured by a comparative example.

FIGS. 1A to 1D are cross-sectional view sequentially illustrating a texturing method of an upper portion of a substrate for a solar cell according to an exemplary embodiment of the present invention and FIG. 2 is a graph showing reflectances measured in a substrate manufactured by FIGS. 1A to 1D and in a substrate manufactured by a comparative example.

Referring to FIG. 1A, a substrate 201 for manufacturing a solar cell is prepared. The substrate 201 is a semiconductor substrate obtained by slicing a semiconductor ingot made of a semiconductor such as silicon. At this time, the substrate 201 is formed of single crystal silicon, but may be formed of polycrystalline silicon.

In slicing the semiconductor ingot, damage portions 202 are generated on a surface of the substrate 201 and the damage portions 202 adversely affect an operation of the substrate 201.

Referring to FIG. 1B, a texturing process is performed to form a plurality concave-convex portions on surface portions, for example, on an upper portion of the substrate 201 using the wet etching. Thus, the upper portion of the substrate 201 has an unevenness surface. Before the texturing process, for protecting an undesired surface (ex. a lower portion) from the texturing, an etch protection layer (now shown) is formed on the undesired surface of the substrate 201 and then is removed after the texturing process is finished. However, alternative embodiments, the etch protection layer may be not formed.

In embodiment, an etchant for the texturing process uses an alkaline wet etchant including a surfactant. For example, the alkaline wet etchant includes an alkaline solution of 0.5 wt % to 23.5 wt % and a surfactant of 0.01 wt % to 0.1 wt % in pure water.

In this embodiment, a potassium hydroxide (KOH) solution is used as the alkaline solution, but may be used at least one selected from the group consisting of the potassium hydroxide (KOH), sodium hydroxide (NaOH) and ammonium hydroxide (NH4OH) and a mixed solution thereof.

The surfactant included in the alkaline wet etchant is a fluorine-containing surfactant. An example of typical fluorine-containing surfactants may be zonyl (FOS-100 manufactured by DuPont. The fluorine-containing surfactant has a function decreasing the surface tension of silicon. Thereby, in texturing the substrate 201, the fluorine-containing surfactant improves a surface wetting ability of the alkaline wet etchant in an initial reaction between the surface of the substrate 201 and the alkaline wet etchant. The alkaline wet etchant does not include IPA (isopropyl-alcohol).

As described above, when the surface of the substrate 201 is etched by the alkaline wet etchant, the damage portions 202 are removed. At this time, an etch rate of the substrate 201 is varied based on a crystal direction of the signal crystal silicon. For example, since an etch rate of (111) surface of silicon is later than that of (100) surface of the silicon, the concave-convex portions 203 are formed on the surface of the substrate 201 by an etch rate difference between the (111) and (100) surfaces so that the surface of the substrate 201 is texted.

When the texturing process of the surface of the substrate 201 is performed, as shown in FIG. 1C, a plurality of air bubbles 204 are generated in surface portions of the substrate 201 by the reaction of the surface of the substrate 201 and the alkaline wet etchant, and the generated air bubbles 204 are adhered on the surface of the substrate 201.

The bubbles 204 adhered on the surface of the substrate 201 disturb an etching operation in the surface positioned under the bubbles 204 and thus an etch rate of the surface of the substrate 201 is varied based whether or not the bubbles 204 are adhered. That is, etch rates between portions (first portions) of the surface of the substrate 201 on which the bubbles 204 are adhered and portions (second portions) of the surface on which the bubbles 204 are not adhered are different from each other. A height difference of the concave-convex portions 203 formed on the surface of the substrate 201 more increases by the difference of the etch rate due to the bubbles 204 as well as the different surface type of (100) and (111), and thereby reflection amount of light on the surface of the substrate 201 is largely reduced so that a reflection reduction effect is improved.

An alkaline wet etchant for texturing a substrate according the prior art had included IPA having a low volatility point in an alkaline solution, so as to improve the surface wetting. Thus, in the texturing process, since the volatilized IPA should be periodically filled for maintaining a predetermined IPA concentration, an inconvenience has occurred and it has been hard to obtain the substrate having a uniform textured surface due to the concentration variation of IPA. However, since the alkaline etchant according to the embodiment does not include IPA, it is not required to fill IPA so that an inconvenience reduces and a surface uniformly textured on the substrate is obtained.

In the embodiment, each concave-convex portion 203 formed on the surface of the substrate 201 has a pyramid shape, but the shape of the concave-convex portion 203 may be varied.

Meanwhile, when the amount of the surfactant included in the alkaline solution is less than about 0.01 wt %, it is difficult to obtain the concave-convex portions 203 of a desired shape, not to have a sufficient texturing effect.

On the contrary, when the amount of the surfactant included in the alkaline solution is more than about 0.1 wt %, the bubbles 204 excessively occurs more than needed. Thus, the texturing time increases and the surface of the substrate 201 is not normally etched. Accordingly, the texturing effect is not obtained.

For example, the texturing of the surface of the substrate 20 is performed by immersing the substrate 201 in a bath including the alkaline wet etchant of about 90° C., in which the surfactant is included, for about 35 min. When the texturing of the substrate 201 is finished, as shown in FIG. 1D, the substrate 201 has a textured surface with the concave-convex portions 203. At this time, the damage portions 202 are removed in the texturing, as described. Accordingly, a reflectance of incident light on the substrate 201 decreases.

According to the embodiment, after the surface of the substrate 201 is textured using the alkaline wet etchant included the surfactant, it is measured a reflectance of the textured substrate 201 and a graph A of the measured reflectance is shown in FIG. 2. In FIG. 2, a graph B is a reflectance of a substrate textured according to a comparative example, and in the comparative example, an acidic wet etchant is used for texturing the surface of the substrate.

The substrates used in the embodiment and comparative example were p-type single crystal silicon substrates of about 125 mm. In addition, the alkaline wet etchant according to the embodiment included a surfactant of about 0.32 wt % into a KOH solution of about 5.2 wt % and the acidic wet etchant according to the comparative example included HF and HNO3.

The texturing was performed by immersing the substrates in a bath including the corresponding etchant of about 90° C. for about 35 min.

The graphs A and B of FIG. 5 were obtained by a reflectance measurement equipment (model name: Solidspec-3700) manufactured by SHIMADZU Corp., and the reflectance measurement was performed at about 400 nm to 1100 nm that is a waveform band contributing to the electric generation.

As shown in FIG. 2, the reflectance A according to the embodiment was smaller than the reflectance B according to the comparative example in most of the waveform band. That is, amount of reflected light on the surface of the substrate reduced. Further, when a value of an average weighted reflectance (AWR) based on the results shown in FIG. 2 was calculated, the value of AWR was about 23% in the comparative example, but about 11.4% in the embodiment. According to the measure result of the values of AWR, when the surface of the substrate was textured by using the alkaline wet etchant including the surfactant, it was known that the reflectance of light was largely reduced.

Next, a method of manufacturing a solar cell using the texturing method described referring to FIGS. 1A to 1D will be described with reference to FIGS. 3 and 4A to 4G.

First, referring to FIG. 3, a solar cell manufactured using the texturing method based on FIGS. 1A to 1D will be described.

Figure 3:
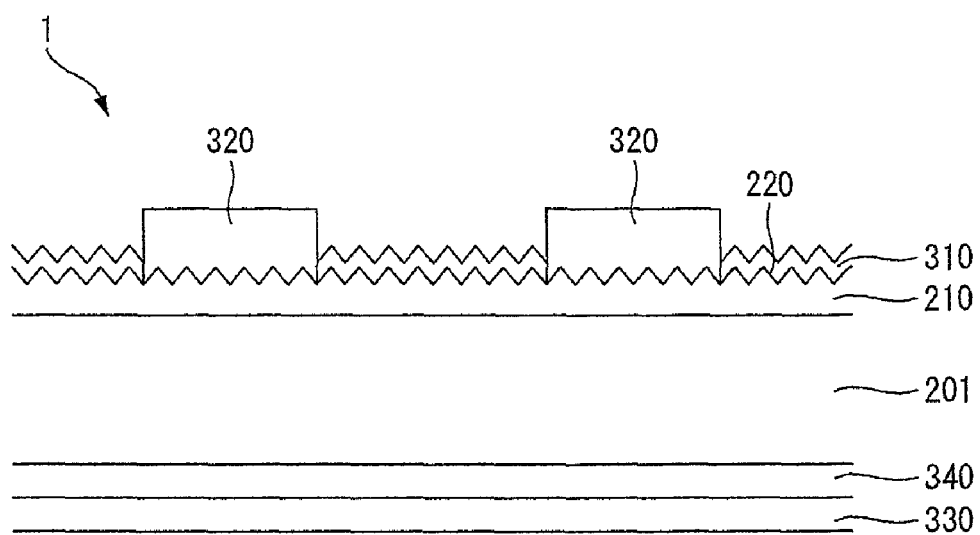
FIG. 3 is a partial cross-sectional view of a solar cell according to an exemplary embodiment of the present invention.

FIG. 3 is a partial cross-sectional view of a solar cell according to an exemplary embodiment of the present invention.

Referring to FIG. 3, the solar cell 1 according to an exemplary embodiment of the present invention includes a substrate 201, an emitter layer 210, an anti-reflection layer 310 positioned on the emitter layer 210, a plurality of first electrodes (hereinafter, refer to as "front electrodes") (320) electrically connected to the emitter layer 210, a second electrode 330 (hereinafter, referred to as "a rear electrode") positioned on the entire rear surface of the substrate 201 and electrically connected to the substrate 201, and a back surface field (BSF) layer 340 positioned between the substrate 201 and the rear electrode 330.

In the exemplary embodiment, the substrate 201 is made of silicon of a first conductive type, for example, p-type. When the substrate 201 has a p-conductive type, the substrate 201 includes impurities of a group III element such as boron (B), gallium (Ga), Indium, etc. However, in an alternative embodiment, the substrate 201 may have an n-conductive type and may be made of polycrystalline silicon or amorphous silicon. Alternatively, the substrate 201 may be made of other semiconductor materials than silicon. When the substrate 201 has the n-conductive type, the substrate 201 may include impurities of a group V element such as phosphor (P), arsenic (As), antimony (Sb), etc.

The emitter layer 210 is an impurity portion that has a second conductive type opposite to the conductive type of the substrate 201, for example, a n-conductive type, and is positioned on the surface on which light is incident, that is, the front surface of the substrate 201. The emitter layer 201 forms a p-n junction with the substrate 201.

The emitter layer 210 serves as a light receiving surface of the solar cell 1 and includes a plurality of concave-convex portions 220 on a surface by texturing an upper portion. Thereby, a light reflectance on the upper portion of the emitter layer 210 is reduced. Further, since a plurality of incident and reflection operations of light are performed on the fine concave-convex portions 220, light is confined inside the solar cell 1. Accordingly, a light absorptance increases and the efficiency of the solar cell 1 is improved.

When light is incident on the semiconductor substrate 201, electron-hole pairs, which are charges are generated. At this time, the generated electron-hole pairs are separated into electrics and holes by a built-in potential difference generated by the p-n junction, and the separated electrons move toward the n-conductive type and the separated holes move toward the p-conductive type. Thus, when the substrate 201 has the p-conductive type and the emitter layer 210 has the n-conductive type, the separated electrons move toward the substrate 201 and the separated holes move toward the emitter layer 210. Accordingly, the holes become major carriers in the substrate 201 and the electrons become major carriers in the emitter layer 210.

Because the emitter layer 210 forms the p-n junction with the substrate 201, when the substrate 201 has the n-conductive type, the emitter layer 210 has the p-conductive type. In this case, the separated electrons move toward the substrate 201 and the separated holes move toward the emitter layer 210.

When the emitter layer 210 has the n-conductive type, the emitter layer 210 may be formed by doping the substrate 201 with of impurities of a group V element such as P, As, Sb, etc. and when the emitter layer 210 has the p-conductive type, the emitter layer 210 may be formed by doping the substrate 201 with of impurities of a group III element such as B, Ga, etc.

The anti-reflection layer 310 made of silicon nitride (SiNx) or silicon oxide (SiO2) is positioned on a surface of the emitter layer 210. The anti-reflection layer 310 reduces the reflectance of incident light and increases a selectivity of a specific wavelength band, thereby increasing the efficiency of the solar cell 1. The anti-reflection layer 310 may have a thickness of approximately 70 nm to 80 nm. The anti-reflection layer 310 may be omitted, if necessary.

The plurality of front electrodes 320 are spaced apart from each other at a constant distance and extend in a direction on the emitter layer 210. The front electrodes 320 are electrically connected to the emitter layer 210.

The front electrodes 320 are made of at least one conductive metal material. Examples of the conductive metal material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive metal materials may be used. Other conductive metal materials may be used.

The rear electrode 330 is positioned on the entire rear surface of the substrate 201 and electrically connected to the substrate 201.

The rear electrode 330 is made of a conductive metal material. Examples of the conductive metal material may be at least one selected from the group consisting of Ni, Cu, Ag, Al, Sn, Zn, In, Ti, Au, and a combination thereof. Other conductive metal materials may be used.

The back surface field layer 340 is positioned between the rear electrode 330 and the substrate 201. The back surface field layer 340 is an area heavily doped with impurities of the same conductive type as the substrate 201. For example, the back surface field layer 340 is a p+ area. Potential barrier is formed due to an impurity concentration difference between the substrate 201 and the back surface field layer 340, thereby distributing the electron movement to a rear portion of the substrate 201. Accordingly, the back surface filed layer 340 prevents the recombination and the disappearance of the separated electrons and the separated holes in the interface of the substrate 201 and the rear electrode 330.

An operation of the solar cell 1 having the structure will be described.

When light irradiated to the solar cell 1 is incident on the substrate 201 of the semiconductor through the anti-reflection layer 310 and the emitter layer 210, electron-hole pairs are generated in the substrate 201 by light energy based on the incident light. At this time, since the upper portion of the emitter layer 210 has the textured surface with the plurality of concave-convex portions 220, a light reflectance on the entire surface of the emitter layer 210 is reduced. Further, a plurality of incident and reflection operations of light by the textured surface are performed and thereby light is confined inside the solar cell 1. Accordingly, a light absorptance increases and the efficiency of the solar cell 1 is improved. Further, since a reflection loss of the incident light on the substrate 201 is reduced by the anti-reflection layer 310, amount of the incident light more increases.

The electron-hole pairs are separated by the p-n junction of the substrate 201 and the emitter layer 210, and the separated electrons move toward the emitter layer 210 of the n-conductive type and the separated holes move toward the substrate 201 of the p-conductive type. The electrons moved to the emitter layer 210 are collected by the front electrodes 320 and the holes moved to the substrate 201 are collected by the rear electrode 330. When the front electrodes 320 and the rear electrode 330 are connected with electric wires (not shown), current flows to thereby use the current as an electric power.

Referring to FIGS. 4A to 4G, a method of manufacturing the solar cell shown in FIG. 3 will be described.

FIGS. 4A to 4G are cross-sectional views sequentially illustrating a manufacturing method of the solar cell shown in FIG. 3.

Figure 4A:
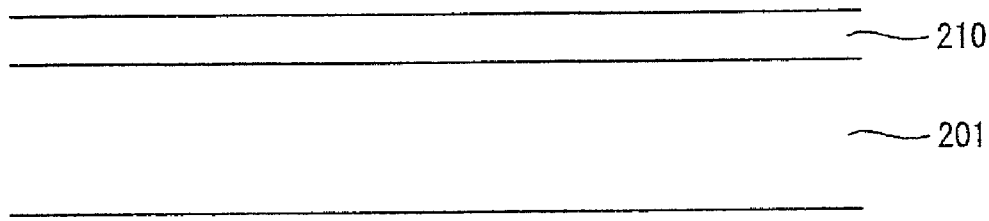
FIGS. 4A to 4G are cross-sectional views sequentially illustrating a manufacturing method of the solar cell shown in FIG. 3.

Referring to FIG. 4A, impurities of a group IV element such as P are diffused or deposited in a substrate 201 made of p-type single crystal silicon, to form an emitter layer 210. Before the formation of the emitter layer 210, a removing process of damage portions (not shown) of the substrate 201 that is generated on a slicing process of silicon may be performed.

Figure 4B:
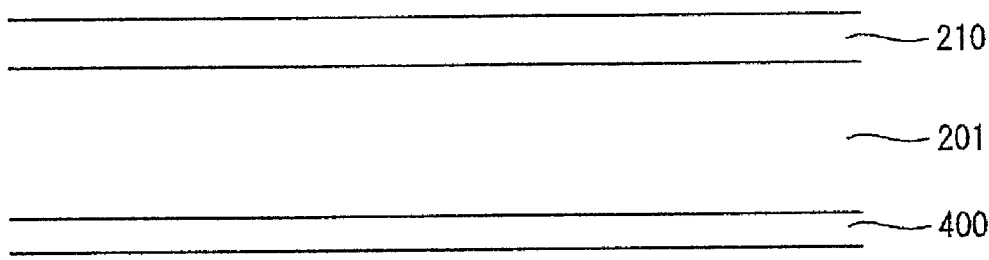

Referring to FIG. 4B, an etch protection layer 400 is formed on another surface of the substrate 201, on which the emitter layer 210 is not formed. At this time, the etch protection layer 400 is made of a material not reacting with an alkaline wet etchant. For example, the etch protection layer 400 may be made of silicon oxide (SiOx), etc.

Figure 4C:
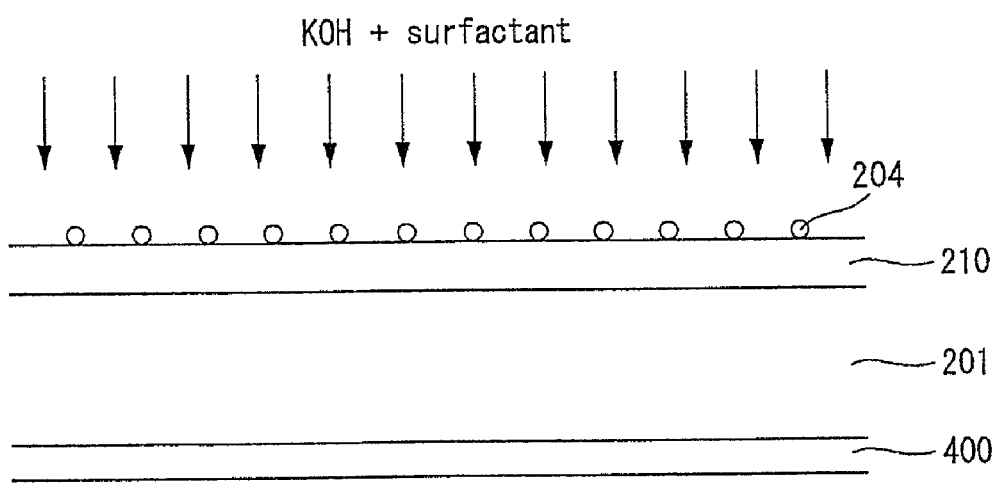

Referring to FIG. 4C, the surface of the emitter layer 210 is etched by the alkaline wet etchant included a surfactant, to perform a texturing process of the emitter layer 210. At this time, the alkaline wet etchant is an etchant including an alkaline solution of 0.5 wt % to 23.5 wt % and the surfactant of 0.01 wt % to 0.1 wt % in pure water.

The texturing process may be performed by immersing the substrate 201 having the emitter layer 210 in the alkaline wet etchant of about 90° C. for about 35 min.

Figure 4D:
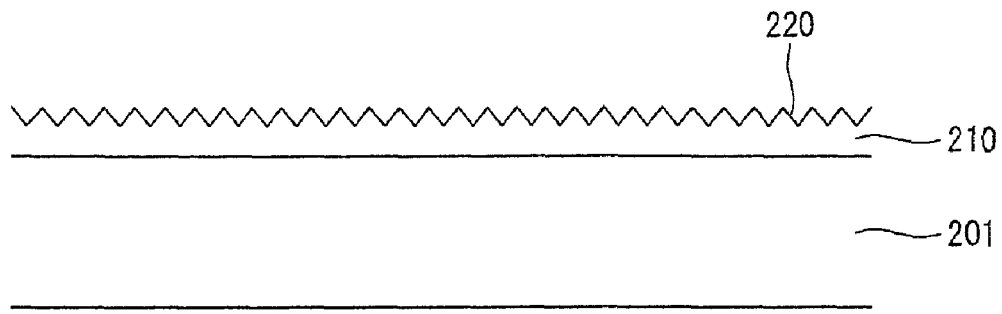

At this time, as shown in FIG. 4C, when the surface of the emitter layer 210 reacts with the alkaline wet etchant, a plurality of air bubbles 204 are generated on portions of the surface of the emitter layer 210 and the bubbles 204 are adhered on the surface of the emitter layer 210. An etch rate on the surface of the emitter layer 210 is delayed due to the bubbles 204, and thereby an etch rate on portions of the surface on which the bubbles 204 are adhered is different from that of the surface on which the bubbles 204 are not adhered. Accordingly, as shown in FIG. 4D, the emitter layer 210 has the textured surface with a plurality of concave-convex portions 220.

At this time, a height difference occurred by an etchant rate difference based on the bubbles 204 is added in a height difference by an etch rate difference based on a crystal surface type such as (100) or (111), thereby more reducing the reflectance of light. In addition, a concave-convex portion shape may be a pyramid shape.

In this embodiment, since the alkaline wet etchant does not include IPA, there is no inconvenience to fill IPA in the alkaline wet etchant.

After the texturing process of the emitter layer 210 is completed, the etch protection layer 400 positioned on the rear surface of the substrate 201 is removed.

Accordingly, as shown in the FIG. 4D, the rear surface of the substrate 201 is not etched by the etch protection layer 400, to maintain a flat surface.

Figure 4E:
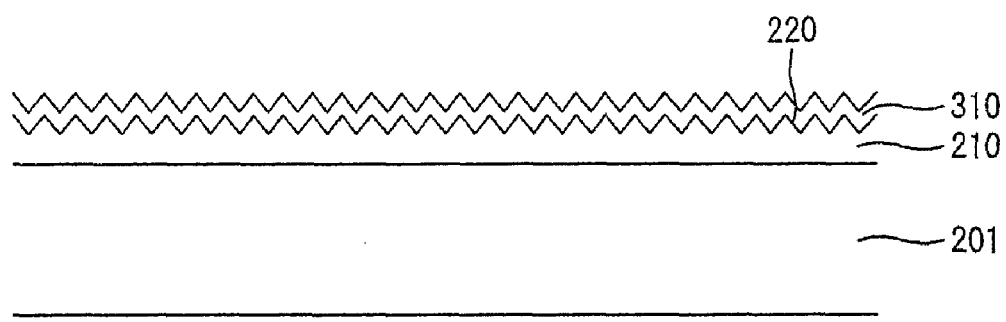

Referring to FIG. 4E, an anti-reflection layer 310 is formed on the entire surface of the emitter layer 210 using a chemical vapor deposition (CVD) method such as a plasma enhanced chemical vapor deposition (PECVD) method. The anti-reflection layer 310 may be made of silicon nitride (SiNx) or silicon oxide (SiO2).

Figure 4F:
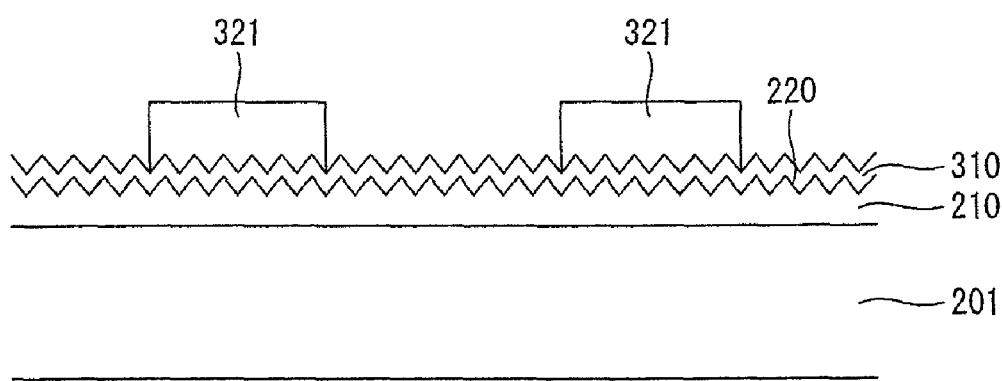

Referring to FIG. 4F, a front electrode paste 321 including Ag is applied on predetermined portions of the anti-reflection layer 310 using a screen printing method and dried at about 170° C.

The front electrode paste 321 may be made of at least one material selected from the group consisting of Ni, Cu, Al, Sn, Zn, In, Ti, Au, and a combination thereof, instead of Ag.

Figure 4G:
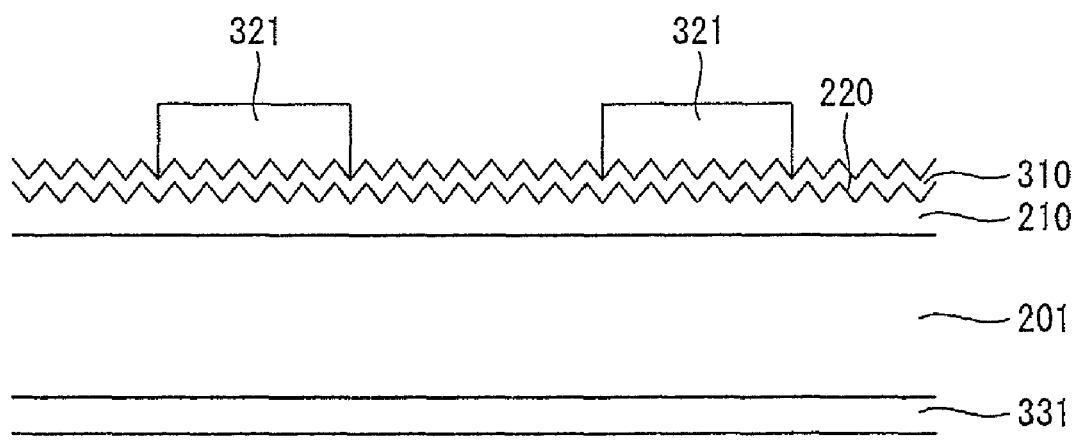

Referring to FIG. 4G, a rear electrode paste 331 is applied on the entire surface of the substrate, on which the emitter layer 210 is not formed, using a screen printing method. The rear electrode paste 331 includes Al, but may include at least one material selected from the group consisting of Ag, Ni, Cu, Sn, Zn, In, Ti, Au, and a combination thereof.

Next, by sintering the substrate 201 at about 750° C. to 800° C., a plurality of front electrodes 320, a rear electrode 330, and a back surface field layer 340 are formed to manufacture the solar cell 1 (refer to FIG. 3).

That is, the front electrode paste 321 contacts with the emitter layer 210 through the anti-reflection layer 310, and thereby the front electrodes 320 and the rear electrode 330 are completed. In addition, the back surface field layer 340, on which p-type impurities are doped heavier than the substrate 201 is formed between the substrate 201 and the rear electrode 330.

In an alternative embodiment, the front electrodes 320 and the rear electrode 330 may be formed on desired portions using a CVD method instead of the screen printing method. At this case, the drying and sintering processes, etc. may be omitted.

In addition, in an alternative embodiment, there may be not necessary to form the etch protection layer 400 on the rear surface of the substrate 201 in the texturing process. Thereby, the rear surface of the substrate 201 as well as the surface of the emitter layer 210 is textured. At this time, after portions of the textured rear surface of the substrate 201 are removed to flat the textured rear surface, the rear electrode 330 may be formed on the flat rear surface of the substrate 201, but the rear electrode 330 may be directly formed on the textured rear surface of the substrate 201.

In FIG. 3, the textured emitter layer 210 is positioned on the light receiving surface, that is, the front surface of the substrate, but may be formed on the rear surface of the solar cell 1, on which light is not incident. At this case, the surface of the emitter is not textured, to have a flat surface, but the front surface of the substrate 201 is textured to have the concave-convex portions 220. The substrate 201 is textured by the same method as the texturing method described above referring to FIGS. 1A to 1D.

Next, short circuit current (Jsc), an open circuit voltage (Voc), a fill factor (FF), and a photoelectric conversion efficiency (EF) measured in the solar cell manufactured by the embodiment are shown in [Table 1].

In [Table 1], a solar cell according to a comparative example has the same structure as that of the embodiment. However, as compared with the embodiment, an emitter layer of the solar cell according to the comparative example is textured using an acidic wet etchant including HF and HNO3. In [Table 1], data of the comparative example is corresponded to short circuit current, an open circuit voltage, a fill factor, and a photoelectric conversion efficiency, respectively.

TABLE 1

|  | Short circuit current (mA/cm2) | Open circuit voltage (mV) | FF (%) | Photoelectric conversion efficiency (%) |
|---|---|---|---|---|
| Embodiment | 34.6 | 625 | 78 | 16.86 |
| Comparative example | 33.7 | 625 | 78 | 16.38 |

As known from the measurement results of [Table 1], the short circuit current of the solar cell according to the embodiment increased by about 0.9 mA/cm2 and the conversion efficiency of the solar cell according to the embodiment was improved by about 0.5%, as compared with the comparative example. Accordingly, when the texturing of the solar cell was performed by the alkaline wet etchant including the surfactant, the light reflectance was effectively reduced to largely improve the efficiency of the solar cell Next, a texturing method of an upper portion of a substrate of a solar cell according to another embodiment of the present invention will be described.

In this embodiment, as compared with FIGS. 1A to 1D, except for a kind of etchant for texturing a substrate and a kind of substrate, the remaining elements are equal. Accordingly, the detailed description of the remaining elements is omitted.

In this embodiment, the etchant for texturing the upper portion is an acidic wet etchant including a surfactant in an acidic wet etch solution. The acidic wet etch solution includes HF and NHO3. The substrate is polycrystalline silicon For example, the etchant of the embodiment is an etchant including a HF solution of about 5wt % to 30 wt %, a HNO3 solution of about 29 wt % to 75 wt %, and a surfactant of about 0.1 wt % to 3 wt % in pure water.

Thereby, when the substrate of the solar cell is polycrystalline silicon, amount of the surfactant is more increased, as compared that the substrate is single crystal silicon, to improve the efficiency of the texturing.

A method of manufacturing a solar cell using the texturing method by the acidic wet etchant of this embodiment is similar to the method described above in reference to FIGS. 3 and 4A to 4G. That is, except that in texturing the surface of the emitter layer, the acidic wet etchant including the surfactant and the acidic wet etch solution of HF and HNO3 is used, the method of manufacturing the solar cell is the same as that shown in FIGS. 3, 4A to 4G, and the method of manufacturing the solar cell according to the embodiment is omitted.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed:

1. A method of texturing a solar cell, the method comprising:
    texturing a surface of a substrate of the solar cell using a wet etchant,
    wherein the wet etchant includes a fluorine-containing surfactant of 0.01 wt % to 0.1 wt % or 0.1 wt % to 3 wt % in pure water.

2. The method of claim 1, wherein the substrate is a single crystal silicon substrate and the wet etchant is an alkaline wet etchant.

3. The method of claim 2, wherein the alkaline wet etchant is an etchant including an alkaline solution of 0.5 wt % to 23.5 wt % in the pure water.

4. The method of claim 3, wherein the alkaline solution is at least one selected from the group consisting of potassium hydroxide (KOH), sodium hydroxide (NaOH) and ammonium hydroxide (NH$_4$OH) and a mixed solution thereof.

5. The method of claim 1, wherein the substrate is a polycrystalline substrate and the wet etchant is an acidic wet etchant.

6. The method of claim 5, wherein the acidic wet etchant is an etchant including the fluorine-containing surfactant in an acidic wet etch solution of HF and HNO$_3$.

7. The method of claim 6, wherein the acidic wet etchant is an etchant including a HF solution of 5 wt % to 30 wt % and a HNO$_3$ solution of 29 wt % to 75 wt %, in the pure water.

8. The method of claim 1, wherein the texturing comprises generating a plurality of bubbles by reacting the wet etchant and the substrate, the plurality of bubbles adhering on a surface of the substrate, and
    an etch rate of first portions of the surface on which the plurality of bubbles are adhered is different from an etch rate of second portions of the surface on which the plurality of bubbles are not adhered.

9. The method of claim 1, wherein the surface is at least an upper portion of the substrate.

10. A method of manufacturing a solar cell, the method comprising:
    forming an emitter layer on a substrate of a first conductive type, the emitter layer being of a second conductive type opposite to the first conductive type;
    texturing a surface of the emitter layer using a wet etchant to form a textured emitter;
    forming a first electrode contacting the textured emitter; and
    forming a second electrode contacting the substrate,
    wherein the wet etchant includes a fluorine-containing surfactant of 0.01 wt % to 0.1 wt % or 0.1 wt % to 3 wt % in pure water.

11. The method of claim 10, wherein the substrate is a single crystal silicon substrate and the wet etchant is an alkaline wet etchant.

12. The method of claim 11, wherein the alkaline wet etchant is an etchant including an alkali solution of 0.5 wt % to 23.5 wt % in the pure water.

13. The method of claim 12, wherein the alkali solution is at least one selected from the group consisting of potassium hydroxide (KOH), sodium hydroxide (NaOH) and ammonium hydroxide (NH$_4$OH) and a mixed solution thereof.

14. The method of claim 10, wherein the substrate is a polycrystalline substrate and the wet etchant is an acidic wet etchant.

15. The method of claim 14, wherein the acidic wet etchant is an etchant including the fluorine-containing surfactant in an acidic wet etch solution of HF and HNO$_3$.

16. The method of claim 15, wherein the acidic wet etchant is an etchant including a HF solution of about 5 wt % to 30 wt % and a HNO$_3$ solution of 29 wt % to 75 wt % in the pure water.

17. The method of claim 10, wherein the texturing comprises generating a plurality of bubbles by reacting the wet etchant and the substrate, the plurality of bubbles adhering on a surface of the substrate, and
    an etch rate of a first surface of the substrate on which the plurality of bubbles are adhered is different from an etch rate of a second surface of the substrate on which the plurality of bubbles are not adhered.

* * * * *